United States Patent [19]

Witzke et al.

[11] Patent Number: 5,094,906
[45] Date of Patent: Mar. 10, 1992

[54] CERAMIC MICROTUBULAR MATERIALS AND METHOD OF MAKING SAME

[75] Inventors: Horst Witzke, Flemington; Bernard H. Kear, Whitehouse Station, both of N.J.

[73] Assignee: Exxon Research and Engineering Company, Florham Park, N.J.

[21] Appl. No.: 507,815

[22] Filed: Apr. 12, 1990

Related U.S. Application Data

[63] Continuation-in-part of Ser. No. 232,078, Aug. 15, 1988.

[51] Int. Cl.$^5$ .................. B01J 32/00; B32B 5/18; B32B 18/00; C04B 38/06; D01F 9/00
[52] U.S. Cl. .................. 428/220; 264/29.2; 264/29.6; 264/81; 264/135; 264/137; 264/221; 264/255; 264/257; 428/288; 428/311.5; 428/337; 428/338; 428/398; 428/698; 501/1; 501/81; 501/95; 502/439; 502/527
[58] Field of Search .................. 264/29.2, 29.6, 81, 264/135, 137, 221, 255, 257; 501/1, 81, 95; 428/220, 288, 311.5, 337, 338, 398, 698; 502/439

[56] References Cited

U.S. PATENT DOCUMENTS

| | | | |
|---|---|---|---|
| 4,900,483 | 2/1990 | Witzke et al. | 264/137 |
| 4,943,472 | 7/1990 | Dyksterhoasl et al. | 428/698 |
| 4,982,068 | 1/1991 | Pollocks et al. | 428/398 |

*Primary Examiner*—James C. Cannon
*Attorney, Agent, or Firm*—Maurice L. Williams

[57] ABSTRACT

Novel ceramic filamentary micro-tubular materials are described. An entirely, fluid-phase method has been devised for producing such interwoven ceramic filamentary tubular materials. The process depends for its success the ability to generate a three-dimensional random weave of ceramic tubes, with diameters in the range of about 0.01 to 2.0 microns, by forming carbon filaments by catalytic decomposition of a hydrocarbon feed, coating the filaments with a ceramic coating and then oxidizing the coated filaments to remove the carbon core leaving behind hollow ceramic micro-tubular filaments. The ceramic micro-tubular materials may be free-standing porous structures and may have a variety of uses as thermal insulators, catalyst supports, superconductor supports, filters or as reinforcements for composites.

14 Claims, 2 Drawing Sheets

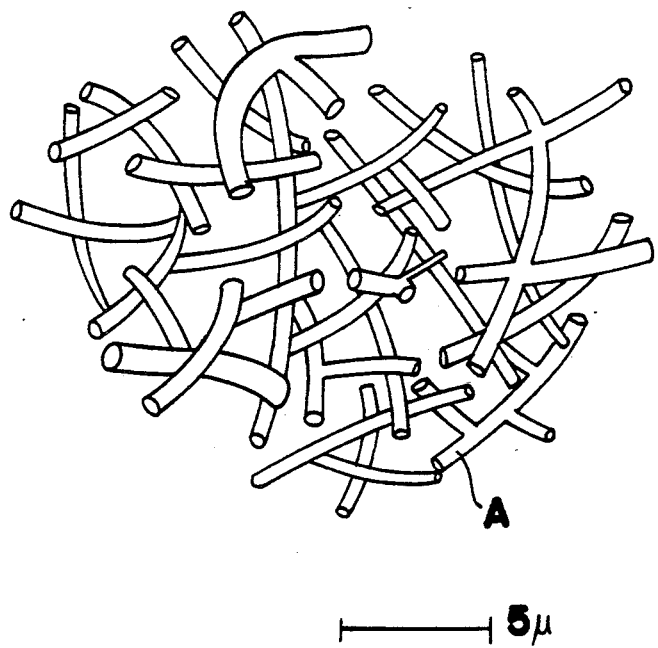
|———| 5μ
F I G. 2
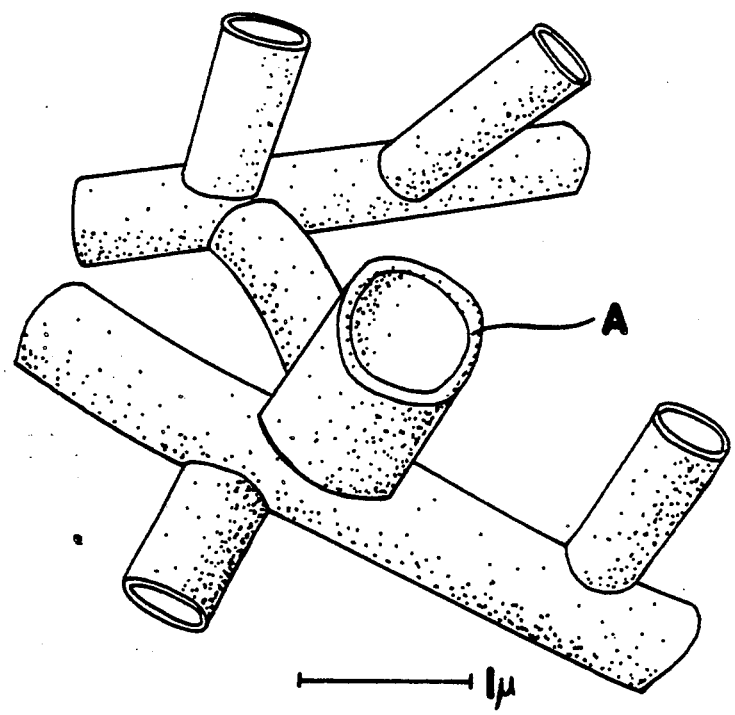
|———| 1μ
F I G. 3

CERAMIC MICROTUBULAR MATERIALS AND METHOD OF MAKING SAME

CROSS-REFERENCE TO RELATED APPLICATION

This is a continuation-in-part of U.S. Ser. No. 232,078 filed Aug. 15, 1988.

Novel ceramic filamentary micro-tubular materials are described. An entirely fluid-phase method has been devised for producing such interwoven ceramic filamentary tubular materials. The process depends for its success on the ability to generate a three-dimensional random weave of ceramic tubes, with diameters in the range of about 0.01 to 2.0 microns, by forming carbon filaments by catalytic decomposition of a hydrocarbon feed, coating the filaments with a ceramic coating and then oxidizing the coated filaments to remove the carbon core, leaving behind hollow ceramic micro-tubular filaments. The ceramic microtubular materials may be free-standing porous structures and may have a variety of uses as thermal insulators, catalyst supports, superconductor supports, filters or as reinforcements for composites.

BACKGROUND OF THE INVENTION

Although many filamentary materials are known for their utility as thermal insulators, there is still need for higher efficiency systems and lower cost fabrication procedures. Today's shuttle tiles, for example, are produced in a costly process from melt-spun filaments of $SiO_2$. To produce the desired tile with controlled volume fraction, the $SiO_2$ filaments are chopped up, randomized, placed in a mold and partially sintered under pressure at elevated temperatures. The sintering process is designed to achieve a specific volume fraction of interwoven filaments that are firmly bonded at points of contact in a random array. Such an open structure has high thermal impedance coupled with modest structural strength, which makes it ideal for shuttle tiles and other insulating purposes where thermal insulation for a transitory period is required.

Our novel synthesis method of a comparable insulating material would involve growing an interwoven network of carbon substrate filaments within a shaped mold, formed in the shape of a shuttle tile, coating the filaments with a Si containing deposit by chemical vapor deposition (CVD), followed by oxidation to eliminate the carbon filament core. The volume fraction as well as the bridging of the filaments is easily controlled by this method as discussed in copending application Ser. No. 113,986, filed Oct. 29, 1987, and now U.S. Pat. No. 4,900,483. An added advantage of this process, in addition to its low-cost, is the ability to produce ultrafine, less than 1 micron in diameter hollow filaments, with controlled diameter and wall thickness. For the same volume fraction, such hollow structures should be even more effective in impeding heat transfer, while sacrificing little in structural strength.

The novel material of this invention may also find utility as a potential replacement for environmentally hazardous asbestos in insulating materials employed in the construction industry. The microtubular material of this invention mimics the structure of asbestos, i.e., it is in the form of thin-walled hollow tubular filaments.

Catalyst supports are generally ceramic materials such as silicon dioxide or aluminum oxide prepared with high surface areas in the form of pellets. The novel material of this invention, if grown in the shape of a brick as for the shuttle tile, can also be employed to construct a very high and controllable surface-area catalyst support bed of predetermined dimensions by stacking the bricks. Such a porous body, now of macroscopic dimensions, can now be loaded with catalyst particles by known methods, for example, liquid infiltration.

Exactly the same concept can also be exploited to fabricate a fixed bed for simple filtration purposes, for example to remove dust particles from the air, or for more sophisticated chemical separations when the surfaces of the filamentary networks have been appropriately pretreated, e.g., to give a chemically absorptive surface.

By the method of the present invention it is also possible to entirely fabricate ultra-fine composites that are reinforced with a three-dimensional, tubular network. This has very broad implications for the design of advanced high specific strength composite structures. In the design of such composites for structural applications, thin-walled tubes are preferred reinforcing, or load-bearing elements. This is because tubes make better use of the intrinsic structural strength of materials than rods of the same dimensions. In engineering practice, tubular elements are frequently linked together to form a three-dimensional structure of great strength and flexibility, e.g., as in a geodesic dome. In nature, similar engineering principles are exploited, but with the added complication that the hollow, or cellular structures are themselves composites of intricate design. Networks of cellulose fibers provide much of the reinforcement in natural composites, e.g., trees, grasses, bamboos. Although many attempts have been made to mimic such natural composite designs, so far these efforts have met with little success, primarily because of the difficulty of making hollow filaments with appropriately small dimensions.

By the method of the present invention, almost any desired filament-filler matrix combination can be produced by utilizing chemical vapor deposition (CVD) to modify the surface properties of the filamentary microtubular material. Infiltration of filler matrix materials can be achieved by adaptation of existing materials technologies.

Yet another application for these porous structures is as substrates for the recently discovered thin superconducting oxide layers. These could be applied by sol-gel techniques, i.e., dipping and draining, or by more advanced techniques such as by CVD from multiple sources. After deposition on the surface of the filaments either an annealing treatment below the melting point, or a brief melting operation may be necessary to coarsen the grain structure of the superconducting phase. It is known that an alumina substrate is ideal for this purpose, in that good wetting between the alumina and the high Tc superconducting oxides occurs, without significant chemical degradation if the exposure time is brief. It is understood that all processing steps be carried out in an oxygen-rich environment in order to maintain the desired stoichiometry of such superconducting phases. After coating the filaments with the desired thickness of the superconducting phase, the structure may be infiltrated with a polymer to achieve the desired flexibility and strength for structural applications such as filament windings for energy storage and transmission.

It is clear from these examples that there are many uses for such novel materials comprised of interwoven networks of ceramic hollow filaments, whether coated or not. Other applications not listed can be envisioned which are obvious to those skilled in the art.

BRIEF DESCRIPTION OF THE FIGURES

FIG. 2 is a drawing of a photomicrograph of a ceramic micro-tubular material as shown by scanning electron microscopy. The Figure shows an entangled weave of ceramic tubes. The letter A indicates one such tube.

FIG. 3 is a drawing of a photomicrograph of a ceramic micro-tubular material at a higher magnification than FIG. 2. The letter A indicates an end of a ceramic tube having an outside diameter of about 1 micron and a wall thickness of about 0.1 micron.

DETAILED DESCRIPTION OF THE INVENTION

Figure 1:
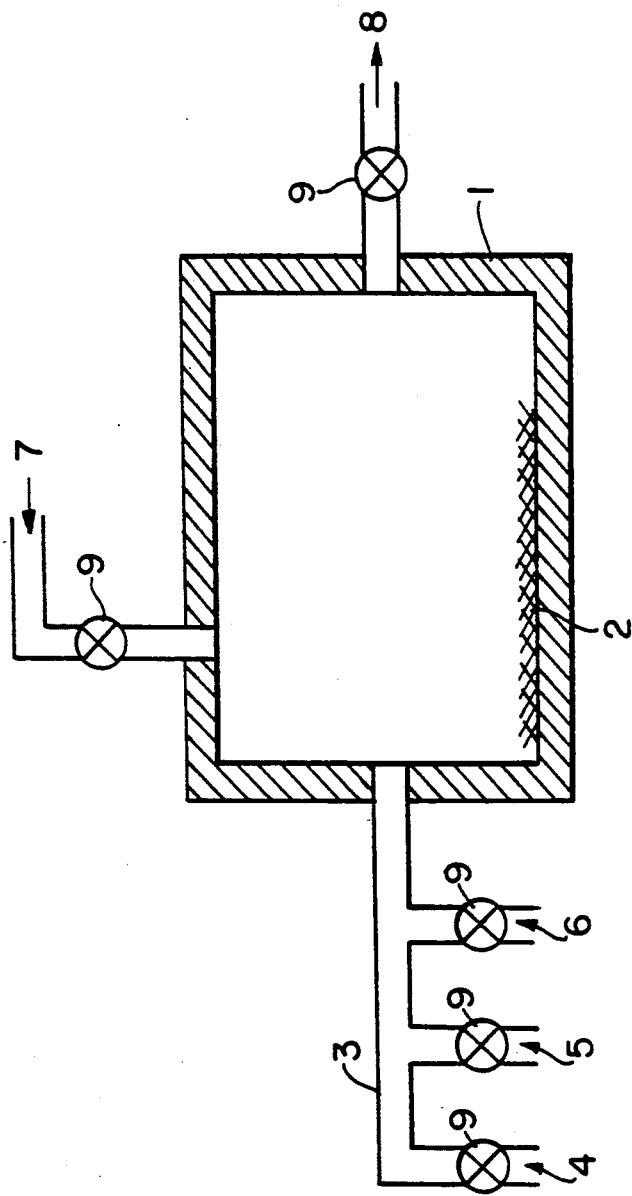
FIG. 1 shows a cross-sectional view of a typical reactor for forming the ceramic micro-tubular material of this invention. There is shown a reactor (1) which may be a metal, glass or ceramic material of a shape selected to provide the desired three-dimensional configuration of the ceramic micro-tubular material containing a catalyst (2) for forming carbon fibers. Conduit 3 is for introducing reactants into the reactor. Hydrocarbon for forming the carbon fibers is introduced through conduit 4, a volatile ceramic precursor is introduced through conduit 5 and oxygen or oxygen containing gas is introduced through conduit 6. A matrix material may be added through conduit 7. Gases may be removed from the reactor through conduit 8. The conduits are fitted with valves (9) to control or stop the flow of the various materials into or from the reactor.

The present invention provides for novel ceramic filamentary micro-tubular materials and a versatile process for making such materials entirely from the gas phase with minimal handling. The process relies on the rapid catalytic growth of carbon filaments at temperatures typically less than about 1000° C. from gas-phase precursors as described in U.S. patent application Ser. No. 113,986, filed Oct. 29, 1987. An example is the catalytic growth of thin filaments of carbon from gaseous hydrocarbons, e.g. ethane at 700° C. using metal alloy catalysts. When specific metal alloy catalysts are employed, as disclosed in the above application, it is in the nature of the growth process that the filaments intertwine to form a three-dimensional random weave (self-woven) network, which has some structural strength as a free-standing form. By appropriate choice of catalyst particles, filaments as small as about 0.01 micron in diameter can be produced.

In the first step of the process, a filamentary carbon network is formed in-situ within a reactor by the catalytic decomposition of a hydrocarbon feed, utilizing metal alloy catalyst particles that are applied to the walls of the reactor. The seeded reactor is placed into a furnace or heated externally to the desired temperature and a hydrocarbon gas is allowed to flow through the reactor. The filamentary network is permitted to grow until the reactor cavity is filled with the desired volume fraction of filaments. After growth, the carbon filaments are converted to tubular ceramic filaments by first coating them with an inorganic material by chemical vapor deposition, electro deposition and electroless deposition and then exposing them to an oxidizing atmosphere such that the carbon filaments are oxidized and removed as carbon monoxide or carbon dioxide. This process may be carried out within the same reactor described above without any need for handling the filamentary network. Thus the carbon network may be coated with a layer of $SiO_2$, for example, applied by CVD using tetraethoxysilane which results in a shape conformal coating, covering all exposed surfaces of the carbon filaments. Hexamethyldisilazane (HMDS) may be used to lay down a $SiC_xN_y$ overlay coating. The coated network is then exposed to an oxidizing environment such as air at about 900° C. for sufficient time to completely oxidize the carbon filamentary core, leaving behind a network of tubular $SiO_2$ filaments of a diameter controlled by the diameter of the carbon filaments. In the case of the HMDS derived coating, the $SiC_xN_y$ coating layer is oxidized to $SiO_2$.

The resulting material now consists of an interwoven network of tubular $SiO_2$ filaments, which is a faithful replica of the original carbon network. To facilitate gasification of the carbon, it is preferable that a relatively thin layer (less than about 0.20 microns) of the coating material be applied, since oxidation of the carbon filaments can take place via diffusion through the very thin oxide coating.

The ceramic tubular materials may be modified by coating them with another material using chemical vapor deposition (CVD), i.e., after the oxidation step above, another coating may be applied to the filaments. The CVD coating may be applied by passing an appropriate volatile precursor through the tubular network inside the reactor at an appropriate temperature, as is well-known, to those skilled in the art of chemical vapor deposition and infiltration. Any desired thickness of a shape conforming coating of a ceramic, metal or carbon may be applied to the network of tubular ceramic filaments.

In order to achieve a net-shape composite structure, the carbon filament growth process is carried out in a shaped mold. The subsequent CVD and oxidation steps of the process are carried out within the same mold. The resulting ceramic tubular structure may then be made into a composite by infiltration of a matrix material. The matrix material is introduced into the mold as a liquid, and allowed to fill the available space between the filaments, thereby forming the shaped composite structure. The resulting shaped composite part, manufactured without any traditional handling, is removed from the mold, and the mold is recycled. The matrix material (infiltrate) may be a polymer, elastomer, metal, alloy or a ceramic and is used in a liquid state during infiltration of the filamentary network. In ceramic matrix systems, Sol-gel technology provides a basis for effective infiltration and densification of the ceramic network. Polymer infiltration may also be achieved by an in-situ process where the monomer is allowed to polymerize inside the mold.

Although the examples given utilize Si containing coatings on the carbon filaments, which results in micro-tubular materials of $SiO_2$, it is clear that other ceramic compositions may also be produced by this invention. For example, an aluminum oxide coated filamentary carbon growth would provide a micro-tubular ceramic material of aluminum oxide after removal of the carbon core by oxidation. The filamentary carbon may also be coated with a thin metal layer, e.g., aluminum, which during the oxidation step will be transformed into the corresponding ceramic oxide. The coating material is chosen either so as to be stable during the oxidation step or such that it will itself be transformed into an oxidation stable ceramic material during the oxidation step.

EXAMPLES

EXAMPLE 1

(A) Ni/Cu alloy powder (70/30 wt. %) was placed into a 2.5 cm diameter, 15 cm long quartz reactor inside a 90 cm long furnace and heated to 700° C. under Argon flowing at 200 cc/min. The growth of filamentary carbon could be observed through an optical window at the exit of the quartz reactor. At temperature, the Ar was replaced by flowing ethane at 100 cc/min. After two hours, the ethane was purged with Ar and the reactor cooled down. The filamentary carbon filled the quartz reactor.

(B) The filamentary carbon growth from (A) above was further treated by coating it with a CVD coating of $SiC_xN_y$ derived from the pyrolysis of hexamethyldisilazane (HMDS). The reactor was reheated to 700° C. under flowing Argon at 200 cc/min. At temperature, the Argon flow was reduced to 100 cc/min and saturated with HMDS vapor by bubbling the Argon through a reservoir of liquid HMDS kept at room temperature. The CVD coating (or infiltration) was carried out for 3 hours. Scanning electron microscope (SEM) and x-ray examination of a sample of the carbon filaments after this HMDS exposure showed that the carbon filaments were coated with a conformal Si containing layer ($SiC_xN_y$) approximately 0.2 microns thick.

(C) The CVD coated filamentary carbon network from (B) was reheated to 900° C. in air for three hours at a flow rate of 100 cc/min. After the air exposure, the filamentary growth was found to be white in appearance and SEM examination revealed that tubular filaments of $SiO_2$ resulted. An example of this material is shown in FIG. 2. The carbon filaments have been volatilized by oxidation, and the $SiC_xN_y$ coating has been oxidized to $SiO_2$, leaving behind micro-tubular filaments of silicon dioxide.

EXAMPLE 2

Example 1 was repeated except that the HMDS in step (B) was replaced by Tetraethyoxysilane and the temperature was lowered to 500° C. during the CVD coating step (infiltration). This precursor is known to deposit $SiO_2$ coatings. After the oxidation step, SEM examination verified that tubular filaments of silicon dioxide had formed as in Example 1.

What is claimed is:

1. A three-dimensional random weave of thin ceramic tubes produced by contacting a metallic catalyst for growing multi-directional carbon fibers with one or more gaseous hydrocarbons in a mold at a temperature sufficient to form filamentary carbon and insufficient to cause the pyrolytic deposition of carbon, depositing a conformal coating consisting of a ceramic or ceramic forming material on the carbon fibers, heating the coated fibers in an oxygen containing atmosphere for a time sufficient to volatilize, by oxidation, all or substantially all of the carbon.

2. A product of claim 1 wherein the conformal coating is deposited by chemical vapor deposition, electroplating or electroless deposition.

3. The product of claim 1 wherein a second conformal coating is deposited on the ceramic tubes after volatilizing the carbon.

4. A product of claim 1 wherein a liquid matrix material is introduced to the mold and converted to a solid after the volatilization step.

5. A three-dimensional random weave of thin ceramic tubes produced by a method comprising: contacting a finely divided metal catalyst for growing multi-directional carbon fibers with one or more gaseous hydrocarbons in a mold at a temperature from the dissociation temperature of the hydrocarbon to about 900° C., depositing a thin conformal ceramic coating of from about 0.1 micron to about 0.5 micron on the carbon fibers, heating the coated fibers in an oxygen containing atmosphere from a time sufficient to volatilize, by oxidation, all or substantially all of the carbon fibers to form ceramic tubes.

6. A product of claim 5 wherein the conformal coating is deposited by chemical vapor deposition, electroplating or electroless deposition.

7. A product of claim 5 wherein a second conformal coating is deposited on the ceramic tubes after volatilizing the carbon.

8. A product of claim 7 wherein the second conformal coating is carbon, a metal, a ceramic compound or mixture thereof.

9. A product of claim 5 wherein a liquid matrix material is introduced to the mold and converted to a solid.

10. A product of claim 9 wherein the matrix material is a polymer, elastomer, epoxy resin, metal, alloy or ceramic.

11. A product of claim 9 wherein the resulting structure has at least one section with a thickness of less than one millimeter.

12. The three-dimensional random weave of thin ceramic tubes produced by the method which comprises: contacting a finely divided catalyst consisting of solid solution of nickel and copper for growing multidirectional carbon fibers with a $C_2$ hydrocarbon gas in a mold at a temperature from about 450° C. to 750° C., depositing a thin conformal ceramic coating on the fibers, heating the coated fibers in an oxygen containing atmosphere from a time sufficient to volatilize, by oxidation, all or substantially all of the carbon fibers to form ceramic tubes.

13. The method of claim 12 wherein the conformal coating has a thickness of about 0.01 micron to about 0.5 micron.

14. The method of claim 12 wherein a second conformal coating is deposited on the ceramic tubes after volatilizing the carbon fibers.

* * * * *